United States Patent
Satta et al.

(10) Patent No.: US 6,391,785 B1
(45) Date of Patent: May 21, 2002

(54) METHOD FOR BOTTOMLESS DEPOSITION OF BARRIER LAYERS IN INTEGRATED CIRCUIT METALLIZATION SCHEMES

(75) Inventors: Alessandra Satta, Leuven; Karen Maex, Herent, both of (BE); Kai-Erik Elers; Ville Antero Saanila, both of Helsinki (FI); Pekka Juha Soininen, Espoo (FI); Suvi P. Haukka, Helsinki (FI)

(73) Assignees: Interuniversitair Microelektronica Centrum (IMEC) (BE); ASM Microchemistry OY (FI)

( * ) Notice: Subject to any disclaimer, the term of this patent is extended or adjusted under 35 U.S.C. 154(b) by 0 days.

(21) Appl. No.: 09/644,636

(22) Filed: Aug. 23, 2000

Related U.S. Application Data

(60) Provisional application No. 60/150,486, filed on Aug. 24, 1999, provisional application No. 60/159,799, filed on Oct. 15, 1999, and provisional application No. 60/176,944, filed on Jan. 18, 2000.

(51) Int. Cl.$^7$ ..................... H01L 21/302; H01L 21/461
(52) U.S. Cl. ........................ 438/704; 438/689
(58) Field of Search ................. 438/622, 633, 438/637, 638, 648, 650, 680, 681, 683, 685, 687, 656, 667, 672, 689, 692, 704, 715, 745, 706, 763

(56) References Cited

U.S. PATENT DOCUMENTS

| | | | | |
|---|---|---|---|---|
| 4,058,430 A | * | 11/1977 | Suntola et al. ............... 156/611 |
| 4,413,022 A | * | 11/1983 | Suntola et al. ............ 427/255.2 |
| 4,747,367 A | * | 5/1988 | Posa ............................ 118/715 |
| 4,761,269 A | * | 8/1988 | Conger et al. ............... 422/245 |
| 5,711,811 A | * | 1/1998 | Suntola et al. .............. 118/711 |
| 5,879,459 A | | 3/1999 | Gadgil et al. ................ 118/715 |
| 5,904,565 A | | 5/1999 | Nguyen et al. .............. 438/687 |
| 5,916,365 A | * | 6/1999 | Sherman ....................... 117/92 |
| 6,077,775 A | | 6/2000 | Strumborg et al. .......... 438/643 |
| 6,083,818 A | | 7/2000 | Stumborg et al. ........... 438/603 |
| 6,100,184 A | * | 8/2000 | Zhao et al. ................... 438/638 |
| 6,184,128 B1 | * | 2/2001 | Wang et al. ................. 438/637 |
| 6,200,893 B1 | * | 3/2001 | Sneh ........................... 438/685 |
| 6,203,613 B1 | * | 3/2001 | Gates et al. ................. 117/104 |
| 6,270,572 B1 | * | 8/2001 | Kim et al. ..................... 117/93 |

FOREIGN PATENT DOCUMENTS

| | | | |
|---|---|---|---|
| DE | 196 27 017 A 1 | 1/1997 | ......... H01L/21/283 |
| DE | 198 20 147 A1 | 7/1999 | |
| WO | WO 96/17107 | * 6/1996 | |
| WO | WO 99/41423 | 8/1999 | |

OTHER PUBLICATIONS

Bedair, S.M., "Selective–area and sidewall growth by atomic by atomic layer epitaxy," *Semicond. Sci. Technol.*, vol. B, (1993), pp. 1052–1062.

J.W. Klaus et al., "Atomically controlled growth of tungsten and tungsten nitride using sequential surface reactions," *Applied Surface Science*, vols 162–163, pp. 479–491 (2000).

(List continued on next page.)

*Primary Examiner*—David Nelms
*Assistant Examiner*—David Nhu
(74) *Attorney, Agent, or Firm*—Knobbe, Martens, Olson & Bear LLP

(57) ABSTRACT

Methods are disclosed for selective deposition on desired materials. In particular, barrier materials are selectively formed on insulating surfaces, as compared to conductive surfaces. In the context of contact formation and trench fill, particularly damascene and dual damascene metallization, the method advantageously lines insulating surfaces with a barrier material. The selective formation allows the deposition to be "bottomless," thus leaving the conductive material at a via bottom exposed for direct metal-to-metal contact when further conductive material is deposited into the opening after barrier formation on the insulating surfaces. Desirably, the selective deposition is accomplished by atomic layer deposition (ALD), resulting in highly conformal coverage of the insulating sidewalls in the opening.

32 Claims, 3 Drawing Sheets

OTHER PUBLICATIONS

P. Martensson et al., "Atomic Layer Epitaxy of Copper on Tantalum," *Chemical Vapor Deposition*, vol. 3, No. 1, pp. 45–50 (1997).

Jae–Sik Min et al., "Metal–organic atomic–layer deposition of titanium–silicon–nitride films," *Applied Physics Letters*, vol. 75, No. 11, pp. 1521–1523 (1999).

Per Martensson and Jan–Otto Carlsson, "Atomic Layer Epitaxy of Copper, Growth and Selectivity in the Cu(ll)–2, 2,6, 6–tetramethyl–3,5–heptanedionate/$H_2$ Process," *J. Electrochem. Soc.*, vol. 145, No. 8, Aug. 1998, pp. 2926–2931.

Jae–Sik, Hyung–San Park, Wonyong Koh, Sang–Won Kang, Chemical Vapor Deposition of Ti–Si–N Films with Alternating Source Supply, *Mat Res. Soc. Symp. Proc. vol. 564*, 1999 Materials Research Society, pp. 207–210.

Mikko Ritala, Markku Leskela, Jan–Pieter Dekker, Cees Mutsaers, Pekka J. Soininen, and Jarmo Skarp, "Perfectly Conformal TiN and $Al_2O_3$ Films Deposited by Atomic Layer Deposition", *Chem Vap. Deposition* 1999, vol. 5, No. 1, pp. 7–9.

J.W. Klaus, O. Sneh, A.W. Ott and S. M. George, "Atomic Layer Deposition of $SiO_2$ Using Catalyzed and Uncatalyzed Self–Limiting Surface Reactions". *Surface Review and Letters*, vol. 6, Nos. 3 & 4 (1999) pp. 435–448.

Mikko Ritala, Pia Kalsi, Diana Riihelä, Kaupo Kukli, Markku Leskelä, and Janne Jokinen, "Controlled Growth of TaN, $Ta_3N_5$, and $O_xN_y$ Thin Films by Atomic Layer Deposition," *Chem. Mater.*, 1999, vol. 11, pp. 1712–1718.*

Jae–Sik Min, Young–Woong Son, Won–Gu Kang, and Sang–Won Kang, "Atomic Layer Deposition of TiN Thin Films by Sequential Introduction of Ti Precursor and $NH_3$," *Materials Research Society*, 1998, vol. 514, pp. 337–343.*

Jae–Sik Min, Young–Woong Son, Won–Gu Kang, Soung–Soon Chun, and Sang–Won Kang, "Atomic Layer Deposition of TiN Films by Alternate Supply of Tetrakis (ethylmethylamino)–Titanium and Ammonia," *Japanese Journal of Applied Physics*, 1998, vol. 37, pp. 4999–5004.*

Mikko Ritala, Markku Leskelä, Eero Rauhala, and Janne Jokinen, "Atomic Layer Epitaxy Growth of TiN Thin Films from $TiI_4$ and $NH_3$," *J. Electrochem. Soc.*, Aug. 1998, vol. 145, No. 8, pp. 2914–2920.

Takeshi Kaizuka, Hiroshi Shinriki, Nobuyuki Takeyasu, and Tomohiro Ohta, "Conformal Chemical Vapor Deposition TiN(111) Film Formation as an Underlayer of Al for Highly Reliable Interconnects," *Jpn. J. Appl. Phys.*, 1994, vol. 33, pp. 470–474.

Mikko Ritala, Markku Leskelä, Jan–Pieter Dekker, Cees Mutsaers, Pekka J. Soininen, and Jarmo Skarp, "Perfectly Conformal TiN and $Al_2O_3$ Films Deposited by Atomic Layer Deposition," *Chem Vap Deposition*, 1999, vol. 5, No. 1, pp. 7–9.

Hiroyuki Sakaue, Masayuki Nakano, Tsutomu Ichihara, "Digital Chemical Vapor Deposition of $SiO_2$ Using a Repetitive Reaction of Triethylsilane/Hydrogen and Oxidation," *Japanese Journal of Applied Physics*, Jan. 1990, vol. 30, No. 1B, pp. L124–L127.

Lauri Niinistö, Mikko Ritala, Markku Leskelä, "Synthesis of oxide thin films and overlayers by atomic layer epitaxy for advanced applications," *Materials Science and Engineering*, 1996, vol. B41, pp. 23–29.

Csaba Düscö, Nguyen Quoc Khanh, Zsolt Horváth, and István Bársony, Research Institute for Materials Science—ATKI, H–1525 Budapest, Hungary; Mikko Utriainen, Sari Lehto, Minna Nieminen, and Lauri Niinistö, Laboratory of Inorganic and Analytical Chemistry, Helsinki University of Technology, FIN–02150 Espoo, Finland, "Deposition of Tin Oxide into Porous Silicon by Atomic Layer Epitaxy," *J. Electrochem. Soc.*, Feb. 1996, vol.143, No. 2, pp. 683–687.

Y. Horiike, T. Ichihara, and H. Sakaue, "Filling of Si oxide into a deep trench using digital CVD method," *Applied Surface Science*, 1990, vol. 46, pp. 168–174.

Kaupo Kukli, Mikko Ritala, and Markku Leskelä, "Atomic Layer Epitaxy Growth of Tantalum Oxide Thin Films from $Ta(OC_2H_5)_5$ and $H_2O$," *J. Electrochem. Soc.*, May 1995, vol. 142, No. 5, pp. 1670–1674.

O. Sneh, M.L. Wise, A. W. Ott, L.A. Okada, and S.M. George, "Atomic layer growth of $SiO_2$ on Si(100) using $SiCl_4$ and $H_2O$ in a binary reaction sequence," *Surface Science*, 1995, vol. 334, pp. 135–152.

Michael L. Wise, Ofer Sneh, Lynne A. Okada, Anne C. Dillon, and Steven M. George, Diethyldiethoxysilane as a New Precursor for $SiO_2$ Growth on Silicon, *Mat. Res. Soc. Sym. Proc.*, 1994, vol. 334, pp. 37–43.

M. Leskelä and M. Ritala, "Atomic Layer Epitaxy in Deposition of Various Oxide and Nitride Thin Films," *Journal De Physique IV, Colloque C5, supplément au Journal de Physique II*, Juin 1995, vol. 5, pp. C5–937–C5–951.

B. Abeles and T. Tiedje, "Amorphous Semiconductor Superlatties," *Physical Review Letters*, Nov. 21, 1983, vol. 51, No. 21, pp. 2003–2006.

L. Hiltunen, M. Leskelä, M. Mäkelä, L. Niinistö, E. Nykänen and P. Soininen, "Nitrides of Titanium, Niobium, Tantalum and Molybdenum grown as Thin Films by the Atomic Layer Epitaxy Method," *Thin Solid Films*, 1988, vol. 166, pp. 149–154.

Per Martensson; Marika Juppo, and Jan–Otto Carlsson, "Use of atomic layer epitaxy for fabrication of Si/TiN/Cu structures," *J. Vac. Sci. Technol. B*, Sep./Oct. 1999, vol. B 17, No. 5, pp. 2122–2128.

Takamaro Kikkawa, Hidemitsu Aoki, Eiji Ikawa, and John M. Drynan, "A Quarter–Micrometer Interconnection Technology Using a TiN/Al–Si–Cu/TiN/Al–Si–Cu/TiN/Ti Multilayer Structure," *IEEE Transaction on Electron Devices*, Feb. 1993, vol. 40, No. 2, pp. 296–302.

T. Kikkawa and K. Kikuta, "Al–Si–Cu/TiN multilayer interconnection and Al–Ge reflow sputtering technologies for quarter–micron devices," *SPIE*, 1992, vol. 1805, pp. 54–64.

P.C. Fazan, V.K. Mathews, N. Sandler, G.Q. Lo, and D.L. Kwong, "A High–C Capacitor (20.4 $fF/\mu m^2$) with Ultrathin CVD—$Ta_2O_5$ Films Deposited on Rugged Poly–Si for High Density DRAMs," *IEEE*, 1992, pp. IDEM 92–263–IDEM 92–266.

* cited by examiner

METHOD FOR BOTTOMLESS DEPOSITION OF BARRIER LAYERS IN INTEGRATED CIRCUIT METALLIZATION SCHEMES

REFERENCE TO RELATED APPLICATIONS

This application claims the priority benefit under 35 U.S.C. §119(e) to prior provisional application No. 60/150,486 of Satta et al., filed Aug. 24, 1999, and to provisional application No. 60/159,799 of Raaijmakers et al., filed Oct. 15, 1999, and to provisional application No. 60/176,944 of Raaijmakers et al., filed Jan. 18, 2000.

FIELD OF THE INVENTION

The method relates generally to integrated circuit processing and fabrication and, more particularly, to metal interconnect structures and the deposition of barrier layers in a selective way.

BACKGROUND OF THE INVENTION

The ongoing focus on miniaturization and the increasing complexity and speed requirements of integrated circuits demand continuously higher density integration. To achieve this, there is an ongoing downscaling in the dimensions of the active devices, as well as of the structures interconnecting these devices. These interconnect structures can comprise multiple metal levels which are, depending on the desired interconnect pattern, either separated from one another by means of interlevel insulating layers or connected to one another by means of a conductive connection through the insulating layer. Besides this downscaling of the dimensions, additional measures are required to be able to meet the stringent speed specifications. Conventionally, the metal levels are aluminum (Al) layers while the insulating layers are oxide layers. In order to reduce the signal delay, one can choose a metal layer with a higher conductivity compared to aluminum and/or choose insulating layers with a lower dielectric constant compared to oxide layers. To meet these objectives copper-containing metal layers and/or copper-containing connections will be introduced in the near future.

The use of copper (Cu) in interconnect structures has some commonly known disadvantages. Cu can have a high diffusion in the surrounding insulating layers, which negatively affects the reliability and the signal delay. Several solutions have been proposed to solve this problem. Materials such as refractory metals have been used as a barrier layer to prevent copper from migrating into the surrounding layers.

The currently used technique inhibits the migration of copper ions in the surrounding layers by depositing a barrier layer in a non-selective way. FIG. 1 illustrates the resulting structure. The conductive bottom surfaces 10 as well as the insulating sidewalls 12 (which include the trench floors 13) of the opening in an insulating layer 14 are covered with a barrier material 16. In case of chemical vapor deposition (CVD), the barrier 16 is conformally deposited. In case of physical vapor deposition (PVD), the coverage of the vertical walls and the bottom of the opening is thinner compared to the coverage of the top of the structure. However, the ratio between vertical and horizontal coverage can be tuned to a certain extent by modifying the process parameters like deposition power, the bias of deposition, etc.

Several problems are related to the deposition of barrier layers. Since the barrier layer is deposited on both the insulating sidewalls 12 and the conductive bottom wall 10 of an opening in an insulating layer 14, 15, the occurrence of a barrier layer on the bottom wall 12 causes several inconveniences. When the opening is filled with a metal 18, the barrier layer 16 between the overlying metal 18 and the underlying metal 20 has a detrimental effect on the electromigration behavior of the structure, since the barrier 16 serves as a flux divergence point for the electrons. Consequently, a discontinuity for the metal atoms occurs with electromigration during subsequent circuit operation.

The presence of the barrier layer 16 on the bottom surface 10 of an opening in an insulating layer creates additional inconveniences. Since the adhesion between the barrier layer 16 and the underlying conductive layer 20 is not always good, the current flowing between the different conductive levels will be influenced, having a negative impact on the reliability and the resistivity of the conductive path.

In U.S. Pat. No. 5,904,565, a direct copper-to-copper connection between different levels in an integrated circuit is disclosed. In a first step, a barrier layer is conformally deposited into the via. In a second step, the barrier layer covering the lower copper level is selectively removed by anisotropically etching. The barrier covering the vertical sidewalls remains. This method implies a more complex process with more process steps than conventional barrier formation, which causes additional difficulties by implementation. Furthermore, the cost will increase.

Consequently, a need exists for a method of forming a direct metal-to-metal contact by selectively depositing a barrier layer on the insulating surfaces of an opening formed in an insulating layer, such that superior conductive behavior of the metal levels in an integrated circuit (IC) can be obtained.

SUMMARY OF THE INVENTION

Methods are described herein for selectively depositing a material, particularly a barrier material, on a substrate. The method selectively provides the material on a first surface while leaving a second surface exposed, where the first and second surfaces differ in material composition. Preferably, the method involves conditioning the first surface to form ligands thereon, and thereafter depositing the barrier layer on the conditioned first surface while avoiding depositing on the second surface.

Desirably, the first surface is of an insulating layer and the second surface is of a conductive layer. More particularly, in the preferred embodiments, a method is described for depositing a barrier layer on part of the sidewalls of an opening passing through at least an insulating layer to a layer consisting essentially of a conductive material is described. This method comprises creating the opening in the insulating layer, conditioning at least insulating sidewalls of the opening to form ligands on these insulating sidewalls, and thereafter depositing the barrier layer on the insulating sidewalls while avoiding deposition of the barrier layer on conductive sidewalls.

In accordance with one aspect of the invention, the method comprises removal of ligands formed on the second surface after conditioning.

In accordance with another aspect of the invention, conditioning results in modification (e.g., chemical or physical modifications) of the first and second surfaces, followed by further modification of the conditioned second surface. The further modification can comprise removal of the conditioning modifications, or converting the conditioning modifications into growth-blocked surface formations. Exemplary further modification includes: heating in a reducing ambient; plasma treatment in a reducing ambient; heating under vacuum or high pressure; or chemical treatment, such as cleaning or a chemical reduction. Alternatively, modification of the second surface can comprise formation of growth-blocking or sacrificial layers, prior to or after the conditioning of first surface.

In an embodiment of this invention, said conditioning is a chemical reaction between chemical molecules being part of said sidewalls of said opening consisting of insulating material and an appropriate atmosphere such that ligands on said sidewalls of said opening are formed. Conditioning can also comprise a chemical reaction between said sidewalls of said opening consisting of said conductive material and an appropriate atmosphere such that ligands on said sidewalls of said opening are formed. Said conditioning can comprise also an additional step being characterized in that said ligands formed on said sidewalls consisting essentially of conductive material are removed.

In accordance with one aspect of the invention, depositing the barrier layer is performed by atomic layer deposition.

In accordance with one aspect of the invention, the opening created in the insulating layer is a via hole, a contact hole or a trench.

In accordance with one aspect of the invention, the insulating material can be silicon dioxide, silicon nitride, silicon oxynitride, a low-k material or a porous material with a low dielectric constant.

In accordance with one aspect of the invention, the ligands are selected from hydroxyl, cyano, $NH_2$, NH, fluoro, bromo, iodo, chloro, methyl, alkoxo, β-diketonato, isopropoxo and other carbon-containing groups.

In accordance with one aspect of the invention, the conductive material can be copper, aluminum, tungsten, cobalt, silver, gold, platinum, palladium, iridium, rhodium or ruthenium.

In accordance with one aspect of the invention, the barrier layer comprises a material selected from the group consisting of nitrides of refractory metals and silicon, carbides of refractory metals and silicon, borides of refractory metals and silicon, phosphides of refractory metals and silicon and oxynitrides of refractory metals and silicon. Particular examples include materials selected from the group consisting of Co, Ta, Ti, TiN, TaN, $Si_3N_4$, $W_xN$, $Hf_xN$, $Mo_xN$ and/or compounds thereof.

BRIEF DESCRIPTION OF THE DRAWINGS

These and other aspects of the invention will be readily understood from the detailed description below and from the appended drawings, which are meant to illustrate and not to omit the invention, and in which.

DETAILED DESCRIPTION OF THE PREFERRED EMBODIMENT

Figure 1:
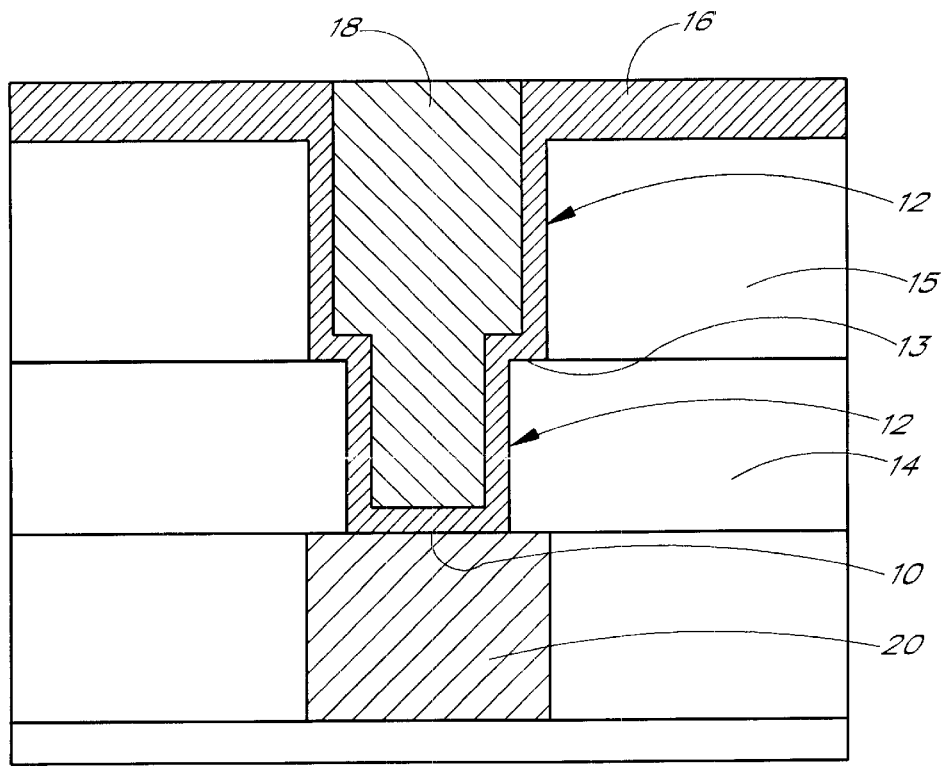
FIG. 1 is a schematic cross-section of a dual damascene structure in an integrated circuit metallization scheme, including a non-selective barrier.

Methods for depositing a layer, preferably a barrier layer, on a substrate are described herein. The substrate includes at least a first surface and a second surface, which differ in material composition. The method preferably includes conditioning at least one of the surfaces to form ligands on the conditioned surface and thereafter depositing a barrier layer on the conditioned surface while avoiding deposition on the non-conditioned surface. Conditioning, as used herein, prepares the surface for further deposition, and in the illustrated embodiment involves making the surface susceptible to an atomic layer deposition (ALD) process to form the desired barrier layer. In contrast, the non-conditioned surface is substantially insensitive to the ALD process for the desired barrier layer. The "non-conditioned" surface can be achieved by failure to condition this surface or by further modification of conditioning on this surface.

While illustrated in the context of selective barrier deposition during dual damascene metallization, the skilled artisan will readily find application for the principles and advantages disclosed herein in other contexts, particularly where selective deposition is desired with high step coverage. The invention has particular utility for depositing selectively on one of insulating and conductive materials, as compared to the other of insulating and conductive materials.

The preferred method includes selectively depositing a barrier layer on first sidewalls of an opening passing through an insulating layer formed on a substrate, and exposing a second sidewall. The first sidewalls are defined as the sidewalls of the opening consisting essentially of the insulating material. The second sidewalls are the sidewalls of the opening consisting essentially of a conductive material. This method provides a direct contact between the different conductive levels in an integrated circuit metallization scheme. Since the barrier layer between the conductive levels has a detrimental effect on the electromigration behavior of the structure, the formation of this barrier layer will be avoided over the second sidewalls.

As noted, a particular object of the preferred embodiments relates to selectively depositing a barrier layer, thereby avoiding the problem of covering a metal layer with a barrier in ultra large scale integration (ULSI) metallization. Damascene technology allows building up horizontal metal patterns as well as vertical metal connections. These connections are required in order to be able to provide a conductive connection between two horizontal metal patterns being processed in an IC. To provide such a connection, usually first openings have to be formed in the insulating layer or in the stack of insulating layers between two different conductive levels. An example of such opening is a trench, a contact hole or a via hole. This opening is filled with the appropriate metal in a subsequent step, such that a vertical connection is realized between two different horizontal conductive levels. To prevent diffusion of the metal in the surrounding insulating layer, a diffusion barrier layer is deposited in the opening before depositing the metal.

Figure 2:
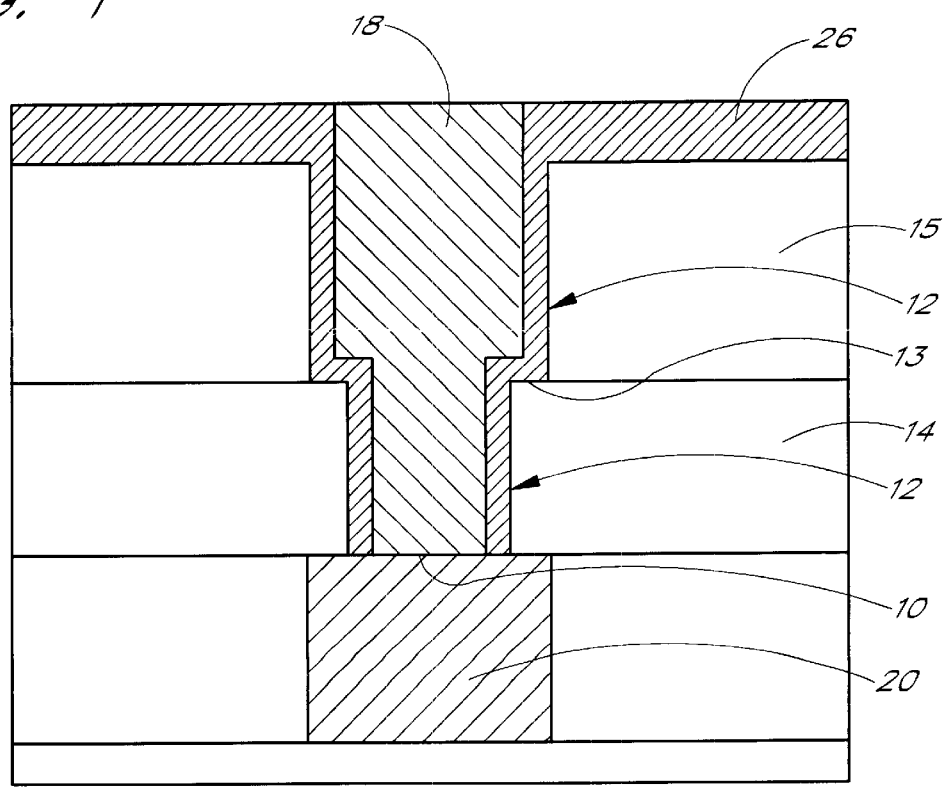
FIG. 2 is a schematic cross-section of a dual damascene structure including a selective barrier, in accordance with the preferred embodiments of the present invention.
Figure 3:
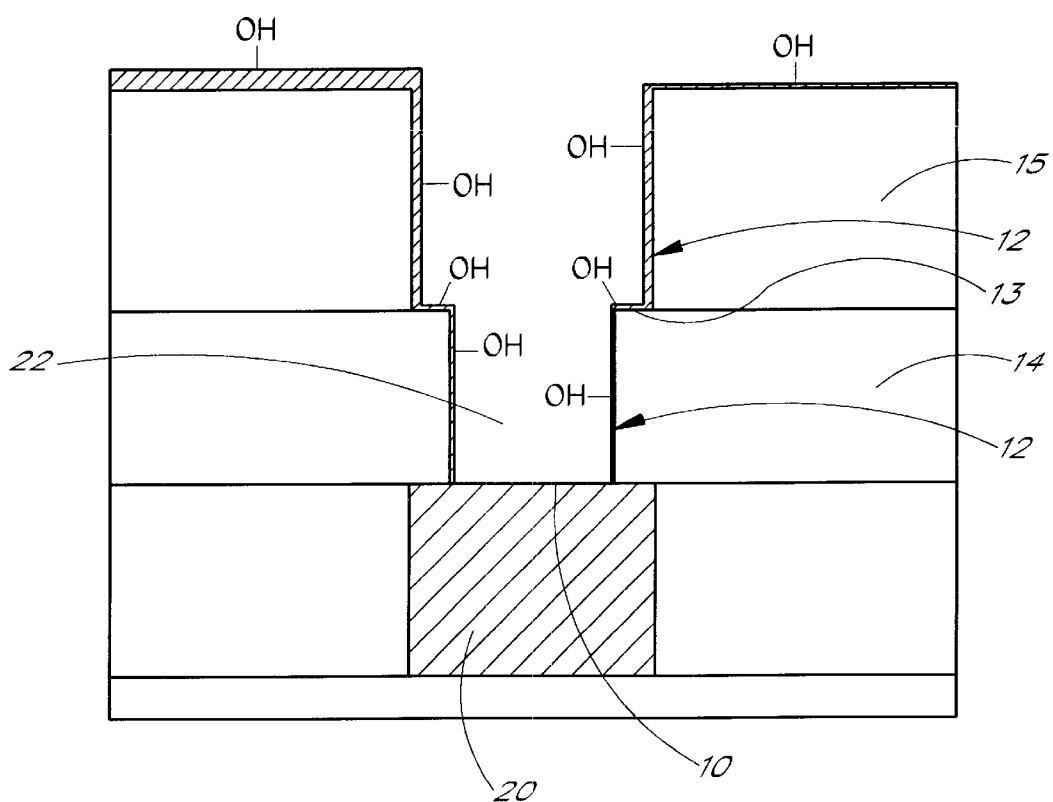
FIG. 3 is a schematic cross-section of a partially fabricated dual damascene structure, showing selective conditioning of insulating surfaces in accordance with an intermediate stage of fabrication, in accordance with the preferred embodiments.

With reference to FIG. 2 (resultant structure) and FIG. 3 (mid-process), wherein like reference numerals are employed to reference like parts as in FIG. 1, the invention is illustrated in the context of integrated circuit metallization. In a ULSI metallization scheme, and more particularly in the damascene approach, horizontal as well as vertical metal connections are formed in surrounding insulating layers 14 and 15. These vertical metal connections are required in order to be able to provide a conductive connection between two horizontal conductive levels. In dual damascene processing, the vertical connection is formed simultaneously with an upper horizontal connection. It will be understood, of course, that the terms "horizontal" and "vertical" as used herein refer only to relative orientations, conventionally used in the art for orientations as they would be if the wafer or chip were horizontal with the devices facing up.

To provide such a connection, first an opening 22 is created in insulating layer(s) 14, 15 formed on a substrate. In the illustrated dual damascene context, the opening 22 includes a trench formed in an upper insulating layer 15, as well as a contact via formed at a discrete location along the trench in a lower insulating layer 14. The skilled artisan will appreciate that, in other arrangements, the opening can comprise a contact via alone or a trench alone.

The opening 22 can be created in the insulating layer(s) 14, 15 by using a hard mask layer on top of the insulating layer(s) 14, 15, among other techniques. The hard mask layer can be, but is not limited to, silicon carbide. The opening 22 in the insulating layer 14, 15 is adjacent to and exposes the conductive layer 20. In state of the art chip designs, the opening 22 will typically have a high aspect ratio, i.e., >2:1, often >4:1. The opening can also be for larger features, e.g., an opening with a linewidth greater than 5 $\mu$m, such as a bonding path or a capacitor.

The opening 22 has first sidewalls 12 and second sidewalls 10. The first sidewalls 12 are defined as the sidewalls of the opening 22 consisting essentially of an insulating material, including "vertical" portions and "horizontal" trench floors 13. The second sidewalls 10 are the sidewalls of the opening 22 consisting essentially of a conductive material, shown at the bottom of the opening 22 in the illustrated embodiment. The insulating layer(s) can be a form of silicon dioxide, silicon nitride, silicon oxynitride, a low-k polymer or a porous material with a low dielectric constant. The insulating layer(s) can also be covered with a material such as silicon carbide, silicon nitride or any other inorganic insulating material. The substrate can be partly processed or a pristine wafer or a slice of semiconducting material, e.g. a glass slice, or a conductive material. The substrate can comprise a patterned conductive layer. Particularly, in case said substrate is a partly processed wafer or slice; at least a part of the active and/or passive devices can already be formed and/or at least a part of the structures interconnecting these devices can be formed.

The opening 22 in the insulating layer(s) 14, 15 can be created by lithography and subsequently by etching the patterned structure. Etching can be dry etching or wet etching, but preferably dry etching. The composition of the etch plasma depends on the characteristics of the insulating material.

In a subsequent step, the opening is preferably cleaned by techniques known in the art.

The sidewalls of the opening 22 are conditioned such that chemical ligands are formed on the first sidewalls 12 of the opening 22. Said chemical ligands are chemical groups or atoms covalently bound to the chemical molecules of the insulating material 22. Conditioning can be a chemical reaction occurring by exposing the substrate and thus the first sidewall to the air or to a dedicated atmosphere such that the chemical composition of the sidewalls is modified, i.e. chemical. Conditioning can also be a chemical reaction from exposing the substrate, and thus the first sidewall 12, to a wet ambient, such as water vapor or a cascade water rinse. Alcohols can also provide suitable conditioning for subsequent deposition.

In some arrangements, conditioning can also mean that no exposure to the air or to a dedicated atmosphere is necessary because the insulating layer can be chosen such that the chemical ligands are already present on the sidewalls of the opening before exposing the cleaned opening to the air. Examples of such naturally conditioned insulating layers include oxide-containing layers. The dedicated atmosphere can also be part of the etching ambient when the openings 22 are created. In this manner, the first sidewalls 12 are conditioned in-situ during etching, which the bottom or second sidewalls 10 is etched clean. Modifications of the second sidewall 10 can be removed during etching.

Chemical ligands are chemical groups or atoms chosen such that they can be selectively replaced by a chemical reaction with another chemical group or chemical molecule present in the atmosphere during at least initial stages of subsequent deposition of the barrier layer. These chemical ligands (and exemplary source fluids for them) include, but are not limited to, hydroxyl (moisture and alcohols), cyano (HCN), $NH_2$ ($NH_3$ and $N_2H_4$), NH ($NH_3$), fluoro (fluorine), bromo (bromine), iodo (iodine), chloro (chlorine), methyl (organics), alkoxo (alcohol), $\beta$-diketonato ($\beta$-diketonato), isopropoxo (isoproxide) and other carbon-containing groups. It will be understood that the source fluids can generally be ionized and provided to the substrate in radical form for more ready attachment of the ligands. The chemical ligands are preferably formed on the first sidewalls 12 (including trench floors 13), consisting of insulating materials in the illustrated embodiment. FIG. 3 show hydroxyl ligands formed only on the insulating first surfaces 12 (including trench floors 13).

Depending on the characteristics of the conductive material, the chemical ligands can also be formed on the second sidewall 10 of the opening 22. In this case, the chemical ligands are desirably selectively removed from the second sidewall 10 of the opening 22. Such selective removal can include, but is not limited to, a moderate heating of the substrate in a reducing ambient or a plasma treatment in a reducing ambient. Advantageously, due to differences in the binding force between the conditioning ligands and different materials, it is generally easier (i.e., requires less energy) to remove ligands from metals such as copper, silver, gold and platinum than it is to remove the same ligands from insulating material.

The layer of conductive material on the second sidewall 10 in contact with the air or another atmosphere can also be modified. This modification can be a chemical reaction such as oxidation or a physical modification such as adsorption of substances. Modification can comprise, for example, forming a blocking layer on the second surface 10 that either does not react with the subsequent deposition chemistries, or results in much slower deposition than over the first surface. As a non-limiting example, —$SiX_n$ ligands (where X=F, Cl, Br or I and n=1, 2 or 3) can be formed with a step of exposure to a silicon halide, which can be a pulse of silicon halide source gas prior to barrier deposition. These blocking ligands more readily form, for example, over oxide at the second surface (e.g., native oxide or oxide formed during the conditioning of the first surface) than over insulating walls of the first surface.

Another exemplary modification of the second surface comprises formation of a sacrificial layer over the second surface. As a non-limiting example, a tungsten oxide layer ($WO_3$) can be formed over the second surface prior to barrier layer formation. If the barrier layer comprises tungsten nitride (WN), formed by ALD from alternating pulses of $WF_6$ and $NH_3$, the sacrificial layer can be slowly etched away during the WN deposition, and particularly during the $WF_6$ pulse as indicated below:

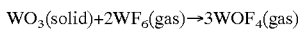
$$WO_3(solid)+2WF_6(gas) \rightarrow 3WOF_4(gas)$$

Any modified layer (e.g., growth-blocking layer or any remainder of a sacrificial layer) is preferably removed after barrier formation and prior to further deposition (e.g., copper fill). Depending upon the material, removal of the modification can include a heating of the substrate under vacuum or high pressure or a chemical treatment such as a cleaning step, a chemical reduction, a selective etch, or a timed wet etch. Note that, depending upon the characteristics of the conductive materials 18, 20 already formed and to be formed in subsequent steps, the modified layer does not necessarily have to be removed in a dedicated process step but can sometimes be removed during further processing. For example, while filling or lining the opening 22 with the conductive material 18, as will be appreciated from the discussion below, surface modifications can be naturally removed.

In a further step, a barrier layer 26 is selectively deposited on the first sidewalls 12 of the opening 22. The barrier layer 26 is essentially not formed on the second sidewall 10 of the opening 10; i.e. the surface of the underlying conductive layer 20 is not covered with a barrier layer. In the preferred embodiment, no ligands are formed on said second sidewall 10 that consists essentially of conductive material and deposition accordingly does not take place. The specific chemical structure of the insulating layer, i.e. the presence of chemical ligands, allows a selective deposition of the barrier layer. The chemical ligands present on the first sidewall 12 will react with the atoms or molecules present in the deposition atmosphere. The chemical atoms or molecules present on the second sidewall 10 of the opening will not react with the atoms or molecules present in the deposition atmosphere. The deposition atmosphere is a chemical solution, vapor or gas consisting essentially of chemical compounds necessary for formation of the barrier layer. As a consequence, a selective deposition of the barrier layer 26 on the first sidewalls 12 of the opening 22 is obtained.

The barrier layer 26 is preferably deposited by Atomic Layer Deposition (ALD). ALD is based on the exchange of chemical molecules or atoms between a material and a deposition atmosphere by atomic layer film deposition. The exchange of chemical molecules or atoms is a chemical reaction. The layer 26 is built up in sequential steps wherein each step involves the formation of one atomic layer by a chemical reaction or adsorption. The barrier layer 26 consists of a material that prevents the diffusion of metal ions in the surrounding insulating layer(s) 14, 15. The barrier layer 26 can be, but is not limited to, a material selected from the group consisting of refractory metals, nitrides of refractory metals and silicon, carbides of refractory metals and silicon, borides of refractory metals and silicon, phosphides of refractory metals and silicon and oxynitrides of refractory metals and silicon. Preferably, the barrier layer 26 includes Co, Ta, Ti, TiN, TaN, $Si_3N_4$, $W_xN$, $Hf_xN$, $Mo_xN$ and/or compounds thereof.

Advantageously, since the barrier material does not interrupt the metal-to-metal path, the barrier material need not be highly conductive. Thus, the preferred embodiments advantageously enable an expanded selection of barrier materials, including materials that have a resistivity range from below 300 $\mu\Omega$-cm to insulating barrier materials. Particularly preferred insulators are amorphous insulators.

The preferred method is a form of atomic layer deposition (ALD), whereby reactants are supplied to the workpiece in alternating pulses in a cycle. Preferably, each cycle forms no more than about one monolayer of lining material by adsorption and preferably by chemisorption. The substrate temperature is kept within a window facilitating chemisorption. In particular, the substrate temperature is maintained at a temperature low enough to maintain intact chemical bonds between adsorbed species and the underlying surface, and to prevent decomposition of the reactant species. On the other hand, the substrate temperature is maintained at a high enough level to avoid condensation of reactants and to provide the activation energy for the desired surface reactions in each phase. Of course, the appropriate temperature window for any given ALD reaction will depend upon the surface termination and reactant species involved.

Each pulse or phase of each cycle is preferably self-limiting in effect. In the example set forth below, each of the phases are self-terminating (i.e., an adsorbed and preferably chemisorbed monolayer is left with a surface non-reactive with the chemistry of that phase). An excess of reactant precursors is supplied in each phase to saturate the structure surfaces. Surface saturation ensures reactant occupation of all available reactive sites (subject to physical size restraints, as discussed in more detail below), while self-termination prevents excess film growth at locations subject to longer exposure to the reactants. Together, saturation and self-terminating chemistries ensure excellent step coverage of the first surfaces 12.

Figure 4:
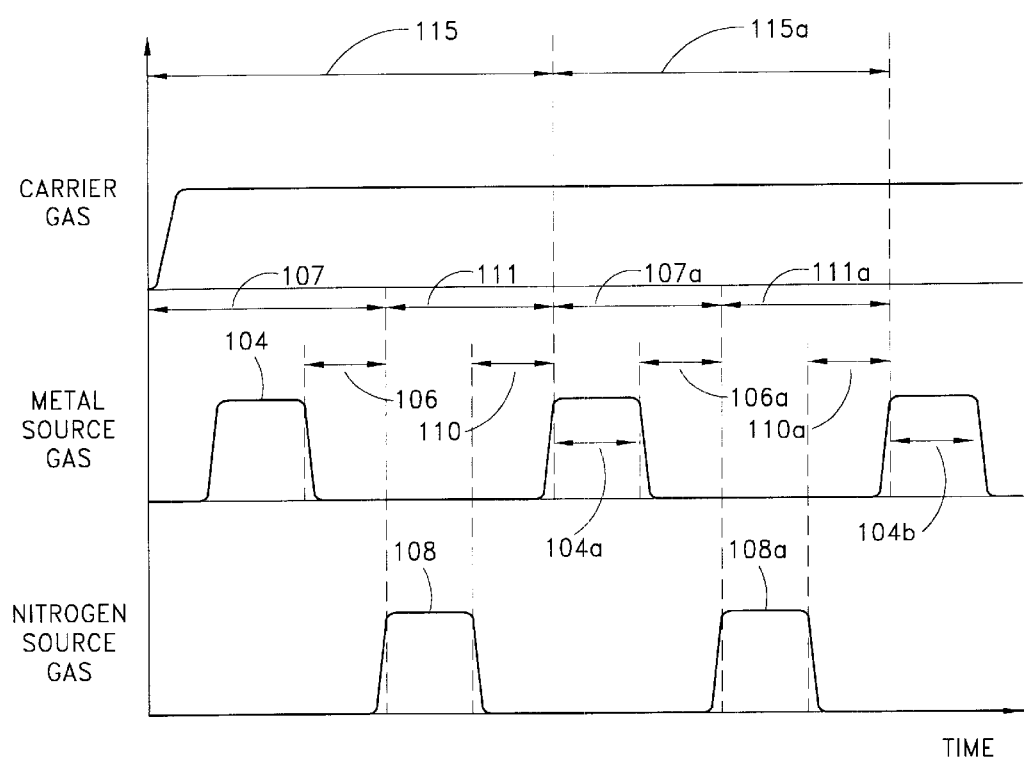
FIG. 4 is an exemplary gas flow diagram for depositing a barrier layer, in accordance with a preferred embodiment of the present invention.

FIG. 4 and Table I below illustrate an exemplary process. A gas flow sequence is represented in accordance with a particular embodiment, which is meant to be exemplary and not limiting. In the illustrated example, a conductive nitride, and more particularly a metal nitride, is formed by supplying the workpiece with a metal source gas alternately with a nitrogen source gas. The first or metal phase 107 of each cycle chemisorbs a layer of metal-containing material, desirably in the absence of the nitrogen source gas. The second or nitrogen phase 111 of each cycle reacts or adsorbs a nitrogen-containing material on the deposited metal-containing layer, desirably in the absence of the metal source gas. It will be understood that, in other arrangements, the order of the phases can be reversed, and that the reactant removal or purge steps can be considered part of the preceding or subsequent reactant pulse.

Surfaces of the damascene structure upon which the lining material is to be formed (i.e., the first surface 12, including the trench floor 13 but excluding the second surface 10) are initially terminated to provide a surface that is reactive with the metal source gas. Reactants of the metal phase 107 can chemisorb upon oxide and nitride surfaces of some preferred damascene structure without separate surface termination.

Most preferably, the metal phase 107 is self-limiting, such that no more than about one atomic monolayer is deposited during the first phase. Desirably, a volatile metal source gas is provided in a pulse 104. Exemplary metal source gases include titanium tetrachloride ($TiCl_4$), tungsten hexafluoride ($WF_6$), tantalum pentachloride ($TaCl_5$), tantalum pentaethoxide, tetrakis(dimethylamino)titanium, pentakis (dimethylamino)tantalum, copper chloride (CuCl) and copper hexafluoroacetylacetonate vinyltrimethylsilane (Cu (HFAC)VTMS).

After a sufficient time for the metal source gas to diffuse into the bottom of the dual dam ascene contact via, shutting off the flow of the metal source gas ends the metal pulse 104. Preferably, carrier gas continues to flow in a purge step 106 until the metal source gas is purged from the chamber.

During the pulse 104, the metal source gas reacts with exposed and selectively terminated surfaces of the workpiece to deposit or chemisorb a "monolayer" of metal-containing species. While theoretically the reactants will chemisorb at each available site on the exposed layer of the workpiece, physical size of the adsorbed species (particularly with terminating ligands) will generally limit coverage with each cycle to a fraction of a monolayer. In the example of Table I below, the ALD process grows metal nitride layers at roughly 0.35 Å/cycle, such that a full monolayer effectively forms from material deposited approximately every 15 cycles for TiN, which has a bulk lattice parameter of about 4.2 Å. Each cycle is represented by a pair of metal source gas and nitrogen source gas pulses. "Monolayer," as used herein, therefore refers to a fraction of a monolayer during deposition, referring primarily to the self-limiting effect of the pulse 104.

In particular, the metal-containing species deposited/adsorbed upon the workpiece is self-terminating such that the surface will not further react with the metal source gas. In the example set forth below, $TiCl_4$ (Table I) leaves a monolayer of chloride-terminated titanium. $WF_6$ would leave a monolayer of fluorine-terminated tungsten. Similarly, other volatile metal halides will leave halide-terminated surfaces, and metal organics, such as tantalum pentaethoxide, tetrakis(dimethylamino)titanium, and pentakis(dimethylamino)tantalum, will leave surface terminated with organic ligands. Such surfaces do not further react with the metal source or other constituents of the reactant flow during the metal source gas pulse 104. Because excess exposure to the reactants does not result in excess deposition, the chemistry during the metal phase 107 of the process is said to be self-limiting. Despite longer exposure to a greater concentration of reactants, deposition on upper surfaces of the workpiece does not exceed deposition on insulating surfaces near the via floor. As noted, the metal phase 107 preferably does not readily react with the second surface 10 (FIG. 3).

In a second phase 111 of the cycle 115, a pulse 108 of a nitrogen source gas is then provided to the workpiece. In the illustrated examples, the nitrogen source gas comprises ammonia. Preferably, the second phase 111 is maintained for sufficient time to fully expose the monolayer of metal-containing species left by the first phase 107 to the nitrogen source gas. After a sufficient time for the nitrogen source gas to diffuse into the bottom of the dual damascene contact via, shutting off the flow of the metal source gas ends the nitrogen pulse 108. Preferably, carrier gas continues to flow in a purge step 110 until the nitrogen source gas is purged from the chamber.

During the nitrogen pulse 108, the nitrogen source gas reacts with or chemisorbs upon the self-terminated metal monolayer left by the first phase 107 upon the first surface 12 (FIG. 3). In the embodiment of Table I, this chemisorption comprises a saturative ligand-exchange reaction, replacing the halogen termination of the metal monolayer with a nitrogen-containing species. In other arrangements, an intermediate getter or scavenging phase first removes the halogen termination of the metal monolayer prior to a nitrogen pulse. In this case, in a third phase the nitrogen-containing species reacts with adsorbs upon the metal left exposed by the getter phase. In either case, a metal nitride is thereby formed selectively upon the first surface 12, preferably in a single monolayer. Desirably, the process leaves a stoichiometric metal nitride. As discussed with respect to the metal phase 107, the monolayer need not occupy all available sites, due the physical size of the adsorbed species. However, the second phase 111 also has a self-limiting effect.

In particular, the nitrogen source gas reacts with the metal-containing species chemisorbed onto the workpiece surface during the previous pulse of metal source gas. The reaction is also surface terminated, since ammonia or other nitrogen source (e.g., hydrazine, N radicals, etc.) during the pulse 108 will not react with nitrogen and $NH_x$ tails terminating the metal nitride monolayer. Moreover, temperature and pressure conditions are arranged to avoid diffusion of ammonia through the metal monolayer to underlying materials. Despite longer exposure to a greater concentration of reactants in this saturative, self-limiting reaction phase 111, the thickness of the metal nitride formed on upper surfaces of the workpiece does not exceed the thickness of the metal nitride formed on insulating surfaces near the via floor. Again, the second surface 10 is preferably non-reactive with the nitrogen pulse.

The metal phase 107 (including metal source pulse 104 and purge 106) and nitrogen phase 108 (including nitrogen source pulse 108 and purge 110) together define a cycle 115 that is repeated in an ALD process. After the initial cycle 115, a second cycle 115a is conducted, wherein a metal source gas pulse 104a is again supplied. The metal source gas chemisorbs a metal-containing species on the surface of the metal nitride formed in the previous cycle 115. The metal-containing species readily react with the exposed surface, depositing another monolayer or fraction of a monolayer of metal-containing species and again leaving a self-terminated surface that does not further react with the metal source gas. Metal source gas flow 104a is stopped and purged 106a from the chamber, and (according to Table I) a second phase 111a of the second cycle 115a provides nitrogen source gas to nitridize the second metal monolayer. Alternatively, the nitrogen phase is preceded by an intermediate getter or scavenging phase.

The cycle 115a is repeated at least about 10 times, and more preferably at least about 20 times, until a sufficiently thick metal nitride is formed to serve a barrier function in the dual damascene structure. Advantageously, layers having a thickness of less than about 200 Å, and more preferably less than about 100 Å, can be formed with near perfect step coverage by the methods of the preferred embodiments. Step coverage relates to the ratio of insulating wall coverage near the bottom of the opening as compared to the upper surface of the substrate. As noted, deposition preferably occurs selectively on the insulator surfaces 12, as compared to the conductive bottom surface 10.

In the subsequent steps, the opening 22, which is partially covered with a barrier layer 26, is filled with a conductive material 18 (FIG. 2) using deposition techniques known in the art. As a result, a direct contact between the opening 22 filled with conductive material 18 and the underlying conductive layer 20 is created. Consequently, no divergence or discontinuity exists between the two conductive levels, yielding a superior conductive behavior, regardless of the resistivity of the barrier material.

In a first embodiment, a method is disclosed for depositing a copper barrier layer in an opening in an insulating layer formed on a substrate.

An insulating layer is deposited on a substrate. The substrate can be a partly processed wafer or a pristine wafer. The substrate is preferably a partly processed wafer. The insulating layer 14, 15 can be deposited on a previously fabricated conductive circuit element 20, which can represent a lower metal level, a contact level or a transistor level. The insulating layer 14, 15 can comprise one of the materials noted above. In the illustrated embodiment, the insulating material comprises a form of silicon dioxide. The insulating layer 14, 15 is patterned, by lithography and dry etch step, such that an opening 22 is formed in the silicon dioxide layer using the dual damascene approach. The first sidewalls 12 of the opening 22 consist of silicon dioxide and second sidewalls 10 consist of conductive material 20. After the dry etch step, the substrate is cleaned. In a next step, the silicon dioxide layer is conditioned in such a way that ligands are formed on the silicon dioxide layer, e.g., a layer of silicon hydroxide is formed. To obtain this, the insulating layer(s) 14, 15 are exposed to a source of H or OH radicals, such as a wet atmosphere, OH or H plasma.

The first sidewall 12, i.e., the surface of the insulating layer 14, 15, reacts with hydrogen and OH radicals present in the plasma. The reaction is only limited to the surface of silicon dioxide exposed to the plasma. Once the entire surface of the first sidewall 12 is saturated with hydroxyl tails or ligands, reaction will spontaneously terminate. In the illustrated embodiment, the first sidewall 12, which comprises silicon dioxide, can also react with moisture present in the air. A spontaneous conditioning will take place.

When the conductive material is copper, the copper layer can be modified, such as by forming a sacrificial layer or ALD blocking layer thereover. As noted above, changes on the chemical structure of the copper layer should generally be removed prior to filling, either prior to or subsequent to lining with the barrier material. Furthermore, substances which are absorbed on the surface should be removed.

A TiN barrier layer 26 is selectively deposited using atomic layer deposition (ALD), based on the exchange of chemical groups during alternating pulses of reactants, each of which preferably form no more than about one monolayer of material. The substrate is brought in contact with $TiCl_4$ in the vapor phase, such that a reaction occurs between $TiCl_4$ and the hydroxyl groups present on the insulating material. Since no hydroxyl ligands are present on the second sidewall 10 of the opening 22, i.e. the sidewall 10 consisting essentially of conductive material, no chemical reaction will take place between the conductive layer and $TiCl_4$. The first reaction product forms a first layer on the insulating surface. Next, a reaction occurs between $NH_3$ and the first reaction product, such that a second layer is formed. In the subsequent steps, the sequence of chemical reactions is repeated until a barrier layer with sufficient thickness is formed.

Table I below provides an exemplary process recipe for forming a TiN layer suitable for a barrier applications in dual damascene metallization schemes for ultra large scale integrated processing. The process recipe represents one cycle in a single-wafer process module. In particular, the illustrated parameters were developed for use in the single-wafer ALD module commercially available under the trade name Pulsar™ 2000, available commercially from ASM Microchemistry Ltd. of Finland.

Note that the parameters in the table below are exemplary only. Each process phase is desirably arranged to saturate at least the first surface 12 of the opening 22. Purge steps are arranged to remove reactants between reactive phases from the vias. Similar ALD processes have been determined to achieve better than 90% step coverage in voids with aspect ratios of greater than about 20:1. In view of the disclosure herein, the skilled artisan can readily modify, substitute or otherwise alter deposition conditions for different reaction chambers and for different selected conditions to achieve saturated, self-terminating phases at acceptable deposition rates.

Advantageously, the ALD processes described herein are relatively insensitive to pressure and reactant concentration, as long as the reactant supply is sufficient to saturate the trench and via surfaces. Furthermore, the processes can operate at low temperatures. Workpiece temperature is preferably maintained throughout the process between about 200° C. and 500° C. to achieve relatively fast deposition rates while conserving thermal budgets during the back-end process. More preferably, the temperature is maintained between about 350° C. and 400° C., and most preferably between about 380° C. and 400° C. Pressure in the chamber can range from the milliTorr range to super-atmospheric, but is preferably maintained between about 1 Torr and 500 Torr, more preferably between about 10 Torr and 100 Torr.

TABLE I

| Phase | Carrier Flow (slm) | Reactant | Reactant Flow (sccm) | Temperature (° C.) | Pressure (Torr) | Time (sec) |
|---|---|---|---|---|---|---|
| metal | 400 | $TiCl_4$ | 20 | 400 | 10 | .05 |
| purge | 400 | — | — | 400 | 10 | 0.8 |
| nitrogen source | 400 | $NH_3$ | 100 | 400 | 10 | 0.75 |
| purge | 400 | — | — | 400 | 10 | 1.0 |

Table I above presents parameters for ALD of a titanium nitride (TiN) barrier into trenches and contact vias of a dual damascene structure. As noted, the metal source gas comprises titanium tetrachloride ($TiCl_4$), the carrier gas comprises nitrogen ($N_2$) and the nitrogen source gas preferably comprises ammonia ($NH_3$).

In the first phase of the first cycle, $TiCl_4$ chemisorbs upon the first surfaces 12 (e.g., OH— or $NH_x$-terminated) of the dual damascene trenches and contact vias. The metal source gas preferably comprises a sufficient percentage of the carrier flow, given the other process parameters, to saturate the damascene surfaces. A monolayer of titanium complex is left upon the trench and via surfaces, and this monolayer is self-terminated with chloride. Advantageously, the lack of conditioning, or modification of conditioning, on the second surfaces 10 prevents adsorption or reaction of the $TiCl_4$ with the second surface.

Desirably, the reactor includes a catalyst to convert the metal source gas to a smaller and/or more reactive species. In the illustrated embodiment, the preferred reaction chamber comprises titanium walls, which advantageously convert $TiCl_4$ to $TiCl_3$. The smaller species readily diffuse into vias, occupy more reactive sites per cycle and more readily chemisorb onto the active sites. Accordingly, the catalyst enables faster deposition rates. The skilled artisan will readily appreciate that other catalysts can be employed for other chemistries.

After the $TiCl_4$ flow is stopped and purged by continued flow of carrier gas, a pulse of $NH_3$ is supplied to the workpiece. Ammonia preferably comprises a sufficient percentage of the carrier flow, given the other process parameters, to saturate the surface of the metal-containing monolayer. The $NH_3$ readily reacts with the chloride-terminated surface of the metal monolayer in a ligand-exchange reaction, forming a monolayer of titanium nitride (TiN). The reaction is limited by the number of available metal chloride complexes previously chemisorbed. Neither ammonia nor the carrier gas further reacts with the resulting titanium nitride monolayer, and the monolayer is left with a nitrogen and $NH_x$ bridge termination. The preferred temperature and pressure parameters, moreover, inhibit diffusion of ammonia through the metal monolayer. Advantageously, the $NH_3$ reactant under these conditions does not react with the second surface 10, which, as noted, has no conditioning or has modified conditioning (e.g., blocking layer or sacrificial layer).

In the next cycle, the first phase introduces $TiCl_4$, which readily reacts with the surface of the titanium nitride monolayer, again leaving a chloride-terminated titanium layer. The second phase of the second cycle is then as described with respect to the first cycle. These cycles are repeated until the desired thickness of titanium nitride is formed.

In the illustrated embodiment, carrier gas continues to flow at a constant rate during both phases of each cycle. It will be understood, however, that reactants can be removed by evacuation of the chamber between alternating gas pulses. In one arrangement, the preferred reactor incorporates hardware and software to maintain a constant pressure during the pulsed deposition. The disclosures of U.S. Pat. No. 4,747,367, issued May 31, 1988 to Posa and U.S. Pat. No. 4,761,269, issued Aug. 2, 1988 to Conger et al., are incorporated herein by reference.

Because the first surface reacts more readily with the (conditioned) first surface than with the (nonconditioned or modified) second surface, the above deposition is selective to the first surface.

Note that a partially selective surface can also accomplish the desired selective result. For example, some ALD processes will deposit at slower rates on metal as compared to insulators, particularly when the ALD process itself produces a competing etch reaction on metal. Similarly, other different materials can result in different deposition rates on a first surface as compared to a second surface. Thus, partially selective deposition results in a thicker layer on insulating surfaces as compared to metal surfaces. The process can be made fully selective by a subsequent isotropic etch that is timed to stop after the thinner layer on the second surface has been completely etched, resulting in some thinning of the desired layer on the first surface. Advantageously, an isotropic etch is more readily achieved and less damaging than an anisotropic etch, such as that disclosed in U.S. Pat. No. 5,904,565.

In a next step, the opening 22, which includes a selective barrier layer 26 and an exposed second surface 10, can be filled with copper. After selective formation of the barrier layer, a seed layer may be desirable, depending upon the method to be employed for filling the dual damascene structure and the conductivity of the deposited barrier layer. In the illustrated embodiment, a copper filler is desirably electroplated over the illustrated metal nitride barriers. Accordingly, a highly conductive seed layer is preferably first formed over the barrier layer 26 and over the exposed second surface 10. As is known in the art, the seed layer preferably comprises a metal layer, more preferably copper, and can be deposited by any of a number of processes. For example, the seed layer can be formed by physical vapor deposition (PVD), e.g., sputtering, chemical vapor deposition (CVD) or atomic layer deposition (ALD). A CVD process can be employed to deposit the seed layer with higher step coverage. Metal organic CVD (MOCVD) techniques are disclosed, for example, by Wolf et al., "Process and equipment simulation of copper chemical vapor deposition using Cu(HFAC)VTMS," Microelectronic Engineering, Vol. 45, No. 1, pp.15–27 (February 1999), the disclosure of which is incorporated herein by reference. If the underlying barrier layer 26 is conductive, the seed layer can also be electroplated or electroless deposited thereover. In conjunction with high step coverage obtained in forming the prior metal nitride barrier layer by ALD, such methods may be adequate for many dual damascene schemes.

Most preferably, the seed layer is also formed by ALD. The volume saved by high step coverage formation of one or more of the adhesion, barrier and seed layers thus contributes to a higher-conductivity line due to a greater volume available for the more conductive filler metal and increased chance of completely filling the contact vias and trenches.

TABLE II

| Phase | Carrier Flow (slm) | Reactant | Reactant Flow (sccm) | Temperature (° C.) | Pressure (Torr) | Time (sec) |
|---|---|---|---|---|---|---|
| metal | 400 | CuCl | 4 | 350 | 10 | 0.2 |
| purge | 400 | — | — | 350 | 10 | 0.5 |
| reduce | 400 | TEB | 40 | 350 | 10 | 0.2 |
| purge | 400 | — | — | 350 | 10 | 0.5 |

Table II above illustrates an ALD pure metal process. In alternating phases, copper chloride is first adsorbed and then reduced by TEB. Advantageously, copper chloride is a smaller reactive species compared to organic copper species, facilitating rapid and more complete saturation of reactive sites on the workpiece.

After formation of the seed layer, the opening is filled with a conductive material by electroless plating or by electroplating. Deposition proceeds to a thickness that is sufficient to complete the bottom-up fill of the openings.

The present invention is described by reference to several preferred embodiments in the foregoing description. It is apparent however that a person skilled in the art can imagine several other equivalent embodiments or other ways of practicing the present invention, the spirit and scope thereof being limited only by the terms of the appended claims.

We claim:

1. A method of selectively depositing a layer using an atomic layer deposition process, the method comprising;
    providing a deposition substrate comprising a first insulating surface and a second surface, the first and second surfaces having different material compositions; and
    selectively coating over the first surface as compared to the second surface by repeatedly alternating exposure of the deposition substrate to at least two reactant fluids.

2. The method of claim 1, wherein the first surface is formed by an insulating material that is selectively coated and the second surface is formed by a conductor.

3. The method of claim 2, wherein the first surface defines an opening in an insulating layer within an integrated circuit and the second surface comprises a metal element exposed by the opening.

4. The method of claim 2, wherein selectively coating comprises depositing a barrier material over the insulating material.

5. The method of claim 4, wherein the barrier material is conductive and has a resistivity less than about 300 $\mu\Omega$-cm.

6. The method of claim 4, wherein the barrier material comprises a metal nitride.

7. The method of claim 6, wherein the barrier material comprises titanium nitride.

8. The method of claim 4, wherein the barrier material is an insulator.

9. The method of claim 1, further comprising conditioning at least the first surface for reaction with the reactant fluids.

10. The method of claim 9, wherein conditioning comprises forming ligands selectively on the first surface.

11. The method of claim 9, wherein conditioning comprises forming ligands on the first surface and the second surface and subsequently modifying the ligands on the second surface.

12. The method of claim 11, wherein modifying the ligands comprises converting the ligands into a growth-blocking layer.

13. The method of claim 11, wherein modifying the ligands comprises removing the ligands selectively from the second surface.

14. The method of claim 13, wherein removing the ligands selectively comprises heating the substrate.

15. The method of claim 14, wherein removing the ligands selectively further comprises exposing the substrate to a reducing ambient.

16. The method of claim 14, wherein removing the ligands selectively further comprises subjecting the substrate to a vacuum.

17. The method of claim 14, wherein removing the ligands selectively further comprises subjecting the substrate to high pressure.

18. The method of claim 13, wherein removing the ligands selectively comprises a chemical reduction.

19. The method of claim 13, wherein removing the ligands comprises cleaning the second surface.

20. The method of claim 9, wherein conditioning comprises exposing the substrate to moisture.

21. The method of claim 9, wherein the first surface comprises a form of oxide and conditioning comprises exposing the substrate to a source H or OH radicals.

22. The method of claim 9, wherein conditioning comprises forming ligands on the first surface selected from the group consisting of hydroxyl, cyano, $NH_2$, NH, fluoro, bromo, iodo, chloro, methyl, alkoxo, β-diketonato and isopropoxo.

23. The method of claim 1, further comprising forming a sacrificial layer over the second surface prior to coating the first surface.

24. The method of claim 23, wherein the sacrificial layer comprises a material susceptible to etching from exposure to the at least two reactant fluids.

25. The method of claim 1, wherein providing comprises plasma etching an opening in an insulating layer to expose a metallic element, thereby producing the first surface on the insulating layer with conditioning ligands thereupon and the second surface on the metallic element without conditioning ligands thereupon.

26. A method of selectively forming a barrier layer over insulating sidewalls of an opening in a partially fabricated integrated circuit, comprising:

forming ligands over insulating surfaces of the partially fabricated integrated circuit, leaving conductive surfaces exposed; and introducing vapor-phase reactants to react with the ligands over the insulating surfaces to selectively deposit a barrier material over the insulating surfaces.

27. The method of claim 26, wherein introducing vapor-phase reactants comprises alternatingly introducing at least first and second vapor-phase reactants in an atomic layer deposition process.

28. The method of claim 26, wherein the ligands are selected from the group consisting of hydroxyl, cyano, $NH_2$, NH, fluoro, bromo, iodo, chloro, methyl, alkoxo, β-diketonato, isopropoxo.

29. The method of claim 26, further comprising removing the ligands from the conductive surfaces.

30. The method of claim 29, wherein removing the ligands comprises reducing.

31. The method of claim 26, wherein forming ligands comprises exposing the insulating surfaces to moisture.

32. The method of claim 26, wherein forming ligands comprises forming hydroxyl tails.

\* \* \* \* \*

UNITED STATES PATENT AND TRADEMARK OFFICE
CERTIFICATE OF CORRECTION

PATENT NO.    : 6,391,785 B1
DATED         : May 21, 2002
INVENTOR(S)   : Satta et al.

It is certified that error appears in the above-identified patent and that said Letters Patent is hereby corrected as shown below:

Column 3,
Line 52, please replace "omit" with -- limit --.

Column 14,
Line 34, please replace "comprising;" with -- comprising: --.

Signed and Sealed this

Eighth Day of April, 2003

JAMES E. ROGAN
*Director of the United States Patent and Trademark Office*